United States Patent
Andre et al.

(10) Patent No.: US 10,573,365 B2
(45) Date of Patent: Feb. 25, 2020

(54) CIRCUIT FOR WORDLINE AUTOBOOTING IN MEMORY AND METHOD THEREFOR

(71) Applicant: Everspin Technologies, Inc., Chandler, AZ (US)

(72) Inventors: Thomas Andre, Austin, TX (US); Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/251,882

(22) Filed: Jan. 18, 2019

(65) Prior Publication Data

US 2019/0221247 A1    Jul. 18, 2019

Related U.S. Application Data

(60) Provisional application No. 62/618,886, filed on Jan. 18, 2018.

(51) Int. Cl.

| | | |
|---|---|---|
| *G11C 11/16* | (2006.01) | |
| *G06F 11/10* | (2006.01) | |
| *G11C 11/4094* | (2006.01) | |
| *G11C 7/12* | (2006.01) | |
| *G11C 8/08* | (2006.01) | |
| *G11C 8/14* | (2006.01) | |

(52) U.S. Cl.
CPC ...... *G11C 11/1673* (2013.01); *G06F 11/1048* (2013.01); *G11C 7/12* (2013.01); *G11C 8/08* (2013.01); *G11C 8/14* (2013.01); *G11C 11/161* (2013.01); *G11C 11/1655* (2013.01); *G11C 11/1657* (2013.01); *G11C 11/1659* (2013.01); *G11C 11/1675* (2013.01); *G11C 11/4094* (2013.01)

(58) Field of Classification Search
CPC ......... G11C 11/1673; G11C 8/08; G11C 8/14; G11C 11/161; G11C 11/1659; G11C 11/1655; G11C 11/1675; G11C 11/4094; G11C 7/12; G11C 11/1657; G06F 11/1048
USPC ......................................................... 365/158
See application file for complete search history.

(56) References Cited

U.S. PATENT DOCUMENTS

| | | | |
|---|---|---|---|
| 8,355,272 B2 | 1/2013 | Andre | |
| 8,811,071 B2 | 8/2014 | Alam et al. | |
| 9,257,165 B2 * | 2/2016 | Andre | G06F 12/0806 |
| 9,286,218 B2 | 3/2016 | Andre et al. | |
| 9,728,259 B1 * | 8/2017 | Jung | G11C 15/046 |

* cited by examiner

*Primary Examiner* — Fernando Hidalgo
(74) *Attorney, Agent, or Firm* — Bookoff McAndrews, PLLC (57) ABSTRACT

In a spin-torque magnetic random access memory (MRAM) that includes local source lines, auto-booting of the word line is used to reduce power consumption by reusing charge already present from driving a plurality of bit lines during writing operations. Auto-booting is accomplished by first driving a global word line to a first voltage. Driving the global word line to a first voltage results in a second voltage passed to the word lines. Subsequent driving of the plurality of bit lines that are capacitively coupled to the word line causes the word line voltage to be increased to a level desired to allow sufficient current to flow through a selected memory cell to write information into the selected memory cell.

20 Claims, 5 Drawing Sheets

CIRCUIT FOR WORDLINE AUTOBOOTING IN MEMORY AND METHOD THEREFOR

CROSS-REFERENCE TO RELATED APPLICATIONS

This application claims the benefit of priority from U.S. Provisional Application No. 62/618,886, filed on Jan. 18, 2018, which is incorporated by reference herein in its entirety.

TECHNICAL FIELD

The disclosure herein relates generally to magnetic memory devices, and, more particularly, to circuits and methods for word line autobooting in such memory devices.

INTRODUCTION

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either one of two possible states relative to the portion having the fixed magnetic state. Because the resistance through the magnetic tunnel junction changes based on the orientation of the free portion relative to the fixed portion, information can be stored by setting the orientation of the free portion. The information is later retrieved by sensing the orientation of the free portion. Such magnetic memory devices are well known in the art.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved.

In the interest of conciseness, conventional techniques, structures, and principles known by those skilled in the art may not be described herein, including, for example, standard semiconductor process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in or otherwise contemplated with respect to an embodiment of described the subject matter.

Writing to magnetic memory cells can be accomplished by sending a spin-polarized write current through the memory cell where the angular momentum carried by the spin-polarized current can change the magnetic state of the free portion of the magnetic tunnel junction. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation represents a logic "1", or vice versa. Thus, the direction of write current flow through the memory cell determines whether the memory cell is written to a first state or a second state. In such memories, the magnitude of the write current is typically greater than the magnitude of a read current used to sense the information stored in the memory cells.

Each memory cell typically includes a magnetic tunnel junction coupled in series with a corresponding selection transistor that allows each memory cell to be individually selected for access. In some architectures, each memory cell is coupled between two common lines, which are often referred to as a bit line and a source line. A memory array typically includes many bit lines and source lines that allow selective access to subsets of the memory cells within the array. Word lines are coupled to the gates of the selection transistors, thereby controlling current flow through the series circuit of each memory cell based on the voltages applied to the ends of the magnetic memory cell by, for example, the bit lines and source lines.

Figure 1:
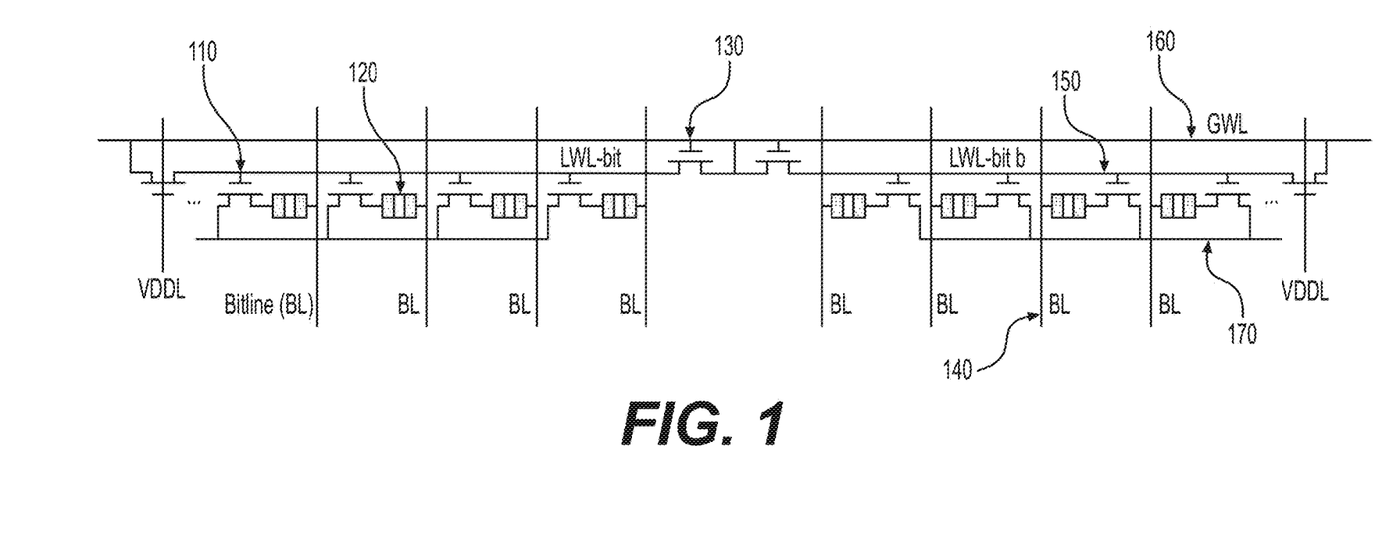
FIG. 1 depicts a schematic diagram of a portion of a magnetic memory device, according to one aspect of the present disclosure.

Embodiments of the present disclosure related to, among other things, circuitry configured to implement word line autobooting in magnetic memory devices. FIG. 1 is a schematic block diagram showing a portion of an example memory device that includes an array of memory cells arranged in rows and columns. In one embodiment, the memory cells are resistive memory elements where information stored in each memory cell is represented by different amounts of resistance perceived by current flowing through the memory cell. Examples of such memory cells include MRAM cells such as spin-torque MRAM cells. In one embodiment, each of the memory cells includes an MTJ where the resistance through the memory cell indicates the information stored in the memory cell. As noted above, such memory devices are well known in the art.

As shown in FIG. 1, the array of memory cells is divided into a number of sets of memory cells. Each of the sets of memory cells includes a corresponding local source line that is shared by all of the memory cells included in the set. For example, each memory cell 120 makes part of a set of memory cells that share a local source line 170. Each of the sets of memory cells may also be referred to as a bit-line group. In the embodiment illustrated, the voltage on each of the local source lines can only be influenced or controlled by driving one or more of the bit lines coupled to the source line. The local source lines are not driven directly, but instead act as a coupling node that allows voltages to be applied on the bit lines coupled to each respective local source line to cause current to flow through the memory cells in one direction or the other depending on the voltages applied. In the example illustrated, each local source line 170 is shared by four memory cells. In other embodiments, 16 memory cells or other numbers of memory cells may be coupled to a local source line in the manner illustrated. Similarly, while a limited number of memory cells are illustrated in the diagram shown in FIG. 1, one of ordinary skill in the art appreciates that a memory array for a magnetic memory device would typically include many thousands or millions of such memory cells.

Within each of the sets of memory cells, a selection transistor is coupled between a first electrode of a corresponding memory cell and the local source line for the set of memory cells. For example, selection transistor 110 is coupled between memory cell 120 and local source line 170. Each of the selection transistors for the set of memory cells is controlled by a word line. In the example, word line 150 controls each selection transistor 110 within each of the sets of memory cells.

For each memory cell 120 in the set, a corresponding bit line of a plurality of bit lines is coupled to a second electrode of the memory cell. For example, a bit line 140 is coupled to the second electrode of memory cell 120. Thus, the memory cell 120 and selection transistor 110 are coupled in series between bit line 140 and local source line 170. In other embodiments, the ordering of the selection transistor and the memory cell may be transposed such that the selection transistor lies between the memory cell and the bit line as opposed to between the memory cell and the source line. In general, the bit lines correspond to the columns of the array, and the word lines correspond to the rows of the array. Thus, the selective driving of the bit lines and word lines within the memory array allows for different memory cells to be accessed for reading and writing operations.

Sense amplifiers and write drivers associated with the source lines and bit lines, which are not shown in FIG. 1, enable read and write currents to be passed through selected memory cells to both store information and later retrieve that information. Examples of such sense amplifiers, write drivers, and related circuitry are discussed in detail in U.S. Pat. No. 8,811,071, which is incorporated by reference herein in its entirety.

When a selected memory cell is to be accessed for a write operation, the bit line associated with the selected memory cell is driven to a high or low voltage, whereas all of the bit lines associated with the other memory cells within the set of memory cells sharing a local source line with the selected memory cell are driven to the opposite low or high voltage. For example, if a selected memory cell is to be accessed for a write operation in which the current flows downward through the memory cell (down-current write), the respective bit line is driven high, while the respective bit lines of non-selected memory cells are driven low. The word line 150 is asserted such that the selection transistors 110 allow current flow through their respective series circuits and an amount of current flows from bit line 140 through memory cell 120 and selection transistor 110 to the shared local source line 170. The current is divided amongst the other three series circuits sharing the local source line 170 such that one third of the current flows through each of the respective selection transistors 110 and their corresponding memory cells 120. While the current through memory cell 120 may be sufficient to cause the free layer within memory cell 120 to change state, only one-third of that current passes through each of the non-selected memory cells, and the system is designed such that the fractional current is insufficient to disturb the magnetic state of those memory cells. In the embodiment illustrated, such a write operation in which the current flows first through the selected memory cell and then through the selection transistor for the selected memory cell may be referred to as a down-current write. In contrast to memory devices in which the source line may be driven directly to cause current to flow through an individual memory cell, in an embodiment with local source lines, the bit lines corresponding to memory cells in the set that are not being accessed are driven to cause current to flow through the selected memory cell. Such local source lines allow for simplified layout of the memory cells and corresponding access circuitry as selection and driving elements are not required for the local source lines.

In determining the number of memory cells to be included within each set of memory cells having a shared local sense line, the current flow needed for switching one of the memory cells can be considered to determine a minimum number of additional memory cells to be included in the set such that the divided current flowing through those additional memory cells is insufficient to disturb those cells. Thus, if one-third of the current could potentially disturb one of the non-selected memory cells, a larger number of memory cells can be included within the set in order to further divide the current through the non-selected memory cells and ensure they are not disturbed.

In the down-current write example given above, bit line being driven high for the selected memory cell, while bit lines are driven low for the non-selected memory cells, results in current flowing downward through the selected memory cell. When of sufficient magnitude, such downward flowing current will result in the free portion of the selected memory cell being forced to a first state that corresponds to either a binary "1" or "0". In order to force the free portion of the selected memory cell to a second state which is opposite the first state and therefore stores the other binary value, an upward current of sufficient magnitude through the selected memory cell is needed (up-current write). In order to achieve this, bit line is driven low for the selected memory cell while each of the bit lines is driven high for the non-selected memory cells. In order for the current to flow, the word line 150 must be driven to a sufficient voltage in order to enable current flow through each of the selection transistors 110.

In one embodiment, when the data in one or more memory cells in a row are to be accessed, the data stored in each of the memory cells to be accessed is sensed and stored in local data-store latches. Such an operation is sometimes referred to as an "activate" operation, and the one or more cells whose information is stored in the local data-store latches can be referred to as a "page." In accordance with the disclosure in U.S. patent application Ser. No. 13/362,599, the activate operation can include a self-referenced read operation that determines the information stored in each of the memory cells in the selected page. The self-referenced read operation includes first sampling the resistance of each of the memory cells in the selected page. After sampling the resistance of the memory cells, the memory cells are all written to a first state. For example, all of the memory cells may be written to a logic "0." Following the write to the entire page of memory cells, the resistance of each of the memory cells is sampled again and compared with the previous sample taken from the same memory cell before the write operation. Based on the comparison, the original state of the memory cell (i.e. "1" or "0") can be determined based on whether or not the resistance changed significantly as a result of the writing operation.

Once the activate operation is complete and the information from the selected page is in the local data-store latches, read and write operations can be performed by retrieving data from and storing data into the local data-store latches. Such a self-referenced read ensures that deviations between the resistance values of different memory cells do not impact the ability to sense the information stored therein. When the read and write operations corresponding to the selected row are complete, a "precharge" operation is performed. While read and write operations to the activated row typically occur before precharging, the precharge operation can also be performed immediately after an activate operation. During the precharge operation, the information in the local data-store latches is transferred to the memory cells in the corresponding row within the memory array. Note that because the sensing operation has left all of the selected memory cells in the row in the first state, only those memory cells that need to be changed to the second state are written during the precharge operation. For example, if the sensing operation writes all of the memory cells to a logic "0" (first state), then only those memory cells that are to store a logic "1" (second state) need to be written during the precharge operation. One of ordinary skill in the art appreciates that the first state may correspond to either a logic "1" or "0" such that the second state corresponds to the complementary "0" or "1" logic value.

As noted above, for a spin-torque MRAM, the first state can be stored in the memory cell by sending a write current of sufficient magnitude through the memory cell in a first direction. Storing the second state in the memory cell is accomplished by sending a write current of sufficient magnitude through the memory cell in a second, opposite direction. As such, an activate operation will only require write current in a first direction, and a precharge operation will only require write current in the opposite direction. As such, activate operations can rely on down-current writes, where, in the embodiment of FIG. 1, the majority of the bit lines are driven low, whereas certain select bit lines will be driven high. In such an embodiment, precharge operations can rely on up-current writes. It should be appreciated that the current direction for activate and precharge operations can be transposed in other embodiments.

A word line driver, which is not shown in FIG. 1, drives the word line 150 when the row of memory cells corresponding to word line 150 is selected for reading or writing operations. Selection of the row corresponding to word line 105 is based on address information provided to the memory device that determines which of the rows of memory cells is to be accessed for reading or writing. Decoding circuitry, which decodes the address information to determine which word line is to be driven, is typically shared such that portions of the decoding circuitry may be used by many word line drivers. Minimizing the area required for each of the selection transistors results in such devices having smaller widths, which in turn increases the on-resistance of the selection transistors when the selected word line is driven. Because having a low on-resistance for the selection transistors is desirable for many reasons, higher word line voltages can be used to decrease the on-resistance of the selection transistors while still allowing those transistors to have a smaller width.

As illustrated in FIG. 1, the series circuit through which current flows for an up-current write is slightly different from that for a down-current write from the perspective of the current flow. In order to ensure proper operation, this difference may require different word line voltages for up-current and down-current writes in order to enable sufficient current flow during those operations. For example, during an up-current write with respect to the selected memory cell, a higher word line voltage on word line 150 results in greater gate-source voltage ($V_{GS}$) on selection transistor 110, which in turn results in a lower resistance across the selection transistor 110 in the series connection with memory cell 120. Such higher word line voltages are sometimes greater in magnitude than the logic supply voltage for the memory device.

In order to increase density in magnetic memories that include spin torque memory cells, local source lines shared by a predefined set of memory cells can be employed in order to reduce the area needed for the memory array. Such local source lines are described in detail in U.S. Pat. No. 8,355,272, which issued Jan. 15, 2013, and which is assigned to the same assignee as the present application. As described in additional detail below, the use of such local source lines can require increased power consumption as a large number of bit lines associated with the memory array are forced to a certain voltage during each operation. As described herein, such additional power consumption can be leveraged to increase or otherwise adjust the voltage of word lines used to drive the selection transistors in the memory array, thereby "auto-booting" the word lines such that they reach a desired voltage level corresponding to writing operations. Thus, such auto-booting techniques enable some of the additional power required for supporting the local source lines to be harnessed and reused in a beneficial manner.

Figure 2:
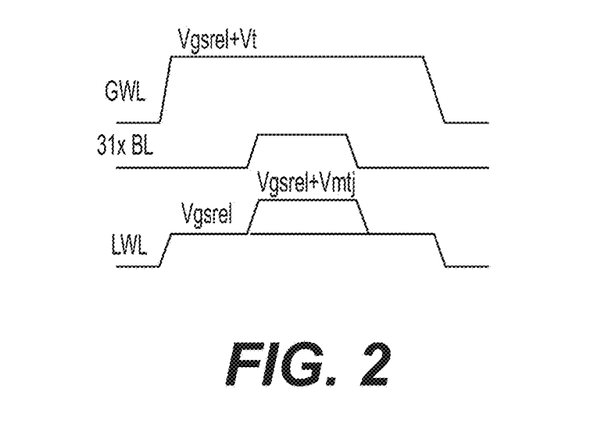
FIG. 2 depicts a timing diagram associated with certain signals included in the schematic diagram of FIG. 1, according to another aspect of the present disclosure.

The use of autobooting of word lines and local source lines to selectively enable current flow through certain memory devices is described in detail in U.S. Pat. No. 9,286,218, which is incorporated by reference herein in its entirety. Embodiments of the present invention provide specific circuits used to implement word line autobooting in memory devices. The specific circuits disclosed enable such autobooting to be enabled without the need for dedicated isolation circuitry, thereby reducing the required area and the need to control such isolation circuitry, which can reduce the speed with which the memory can operate. The circuits disclosed also allow the transistors used in autobooting to be thin oxide devices. Complementary (differential) implementations are shown but not required to implement the circuits disclosed. With the circuits disclosed herein, precharging and autobooting can be done with simplified control in less time with little stress on the transistors Turning back to FIG. 1, a diode-connected transistor 130 allows dedicated isolation circuitry to be avoided while allowing local word line 150 to be autobooted to a voltage level higher than the reliable word line voltage (Vgsrel ("reliable gate-to-source voltage"). In some embodiments, diode-connected transistor 130 may be a thin-gate NMOS transistor due to its resistance to time-dependent breakdown stress. FIG. 2 illustrates a timing diagram corresponding to certain signals of FIG. 1. For example, global word line (GWL) 160 may pass Vgsrel to local word line (LWL) 150 via diode-connected transistor 130. In some embodiments, 32 bit lines are assumed to be connected via respective memory cells (e.g., magnetic tunnel junction 120 in series with a selection transistor 110) to shared local source line 170. After global word line 160 is asserted to Vgsrel+Vt, and diode-connected transistor 130 has passed Vgsrel to local word line 150, bitlines (BLs) 140 corresponding to the non-selected memory cell in the local source line group are driven high, thereby causing, via capacitive coupling, the voltage on local word line 150 to autoboot to a higher voltage level (e.g., Vgsrel+Vmtj) that facilitates the access operation for the selected memory cell. When local word line 150 exceeds the Vgsrel level, diode-connected transistor 130 for that local source line group turns off. In some embodiments, the circuit layout of FIG. 1 may be differential in that one local source line group may be autobooted, while other local source line groups are not.

Figure 3:
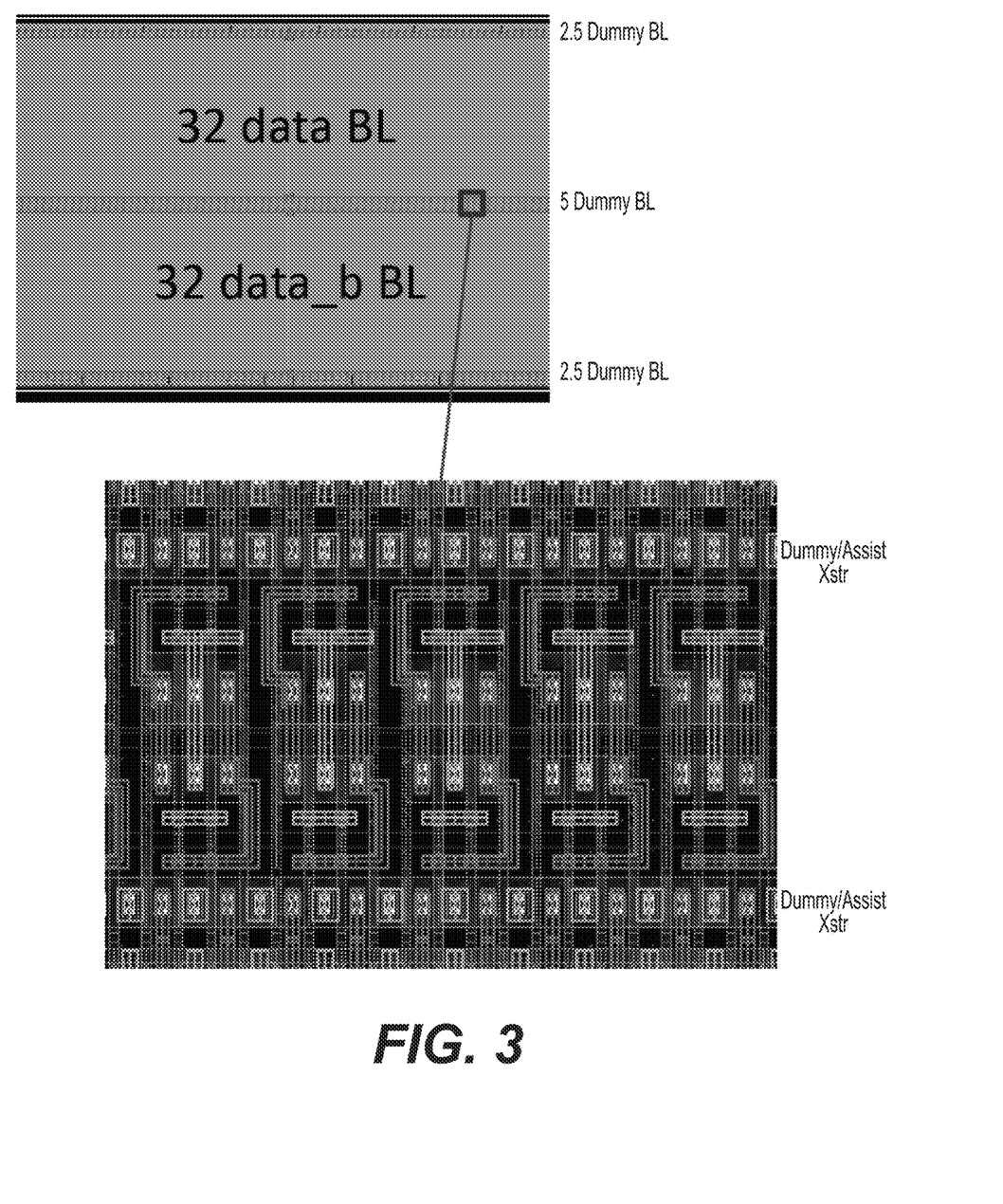
FIG. 3 depicts a circuit layout of a magnetic memory device, according to another aspect of the present disclosure.

Turning to FIG. 3, a portion of a circuit depicts an illustrative word line strap layout. In some embodiments, even word lines may be controlled by top and bottom straps. In other embodiments, odd word lines may be controlled by a center strap. In yet other embodiments, adjacent memory arrays may merge to look centered. Edge arrays may be capped off to form a full strap section. Dummy transistors between strap and real columns may allow for uniformity in row (RX) spaces. This may have the advantage of providing a local source line (LSL) assist. In some embodiments, a total 10 bit line adder may be used for every 64 bit lines. In other embodiments, increasing the size to 128 bit lines may increase local source line power consumption.

Figure 4:
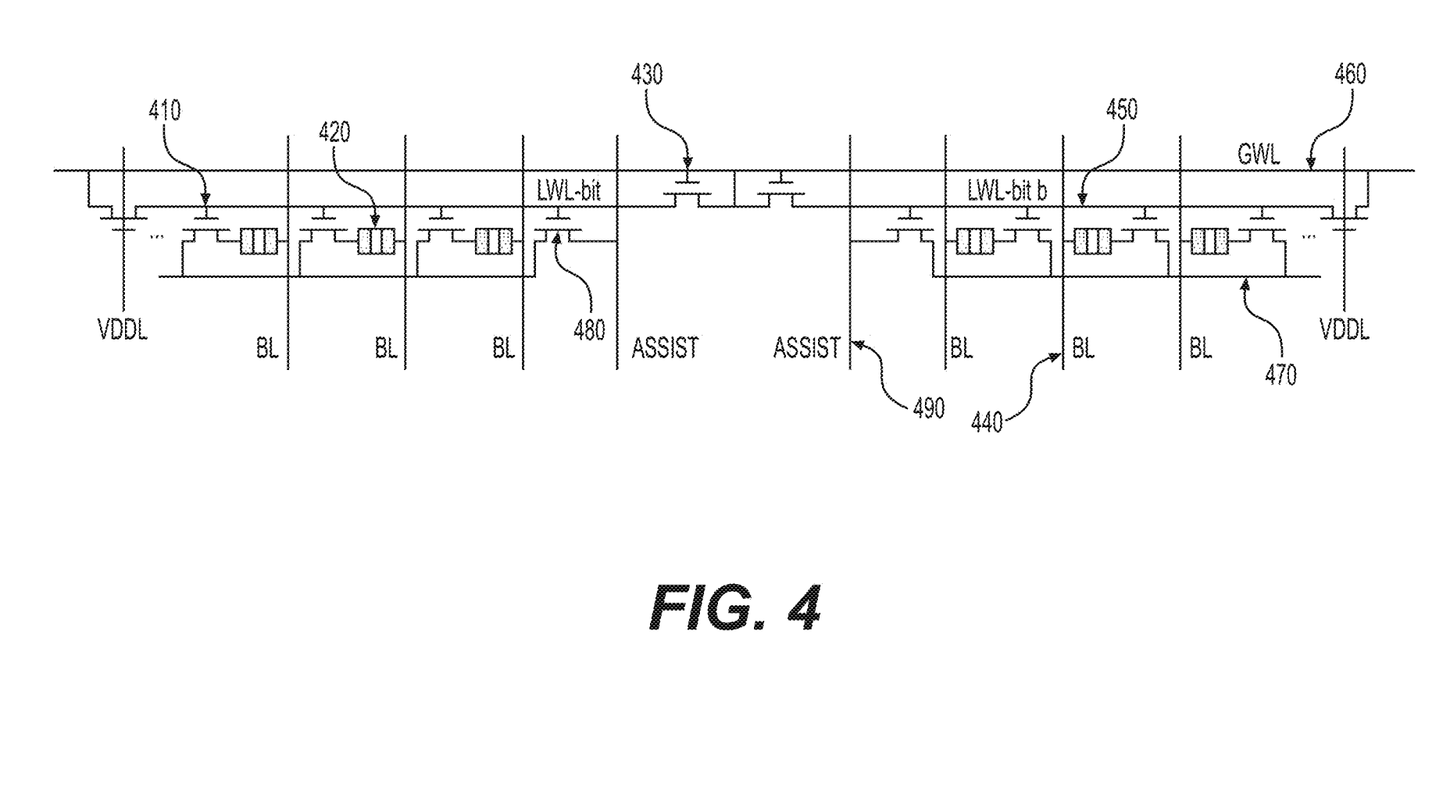
FIG. 4 depicts a schematic diagram of a portion of a magnetic memory device, according to another aspect of the present disclosure.

FIG. 4 depicts another embodiment in which a local source line (LSL) assist may improve autobooting. The improvement may be realized by not including a magnetic tunnel junction between the assist lines and the respective transistor coupled to the local word line. For example, transistor 480 may connect local source line 470 to assist line 490 by local word line 450. There is no magnetic tunnel junction between assist line 490 and transistor 480. In other embodiments, each local assist line 470 may include a 0.16µ assist transistor on top and bottom. In the example in which 32 bit lines are contemplated, the use of assist lines may result in less current flow through the 31 unselected memory cells. The use of assist lines may reduce the voltages required on the respective bit lines, thus reducing the current flow through the unselected magnetic tunnel junctions.

Figure 5:
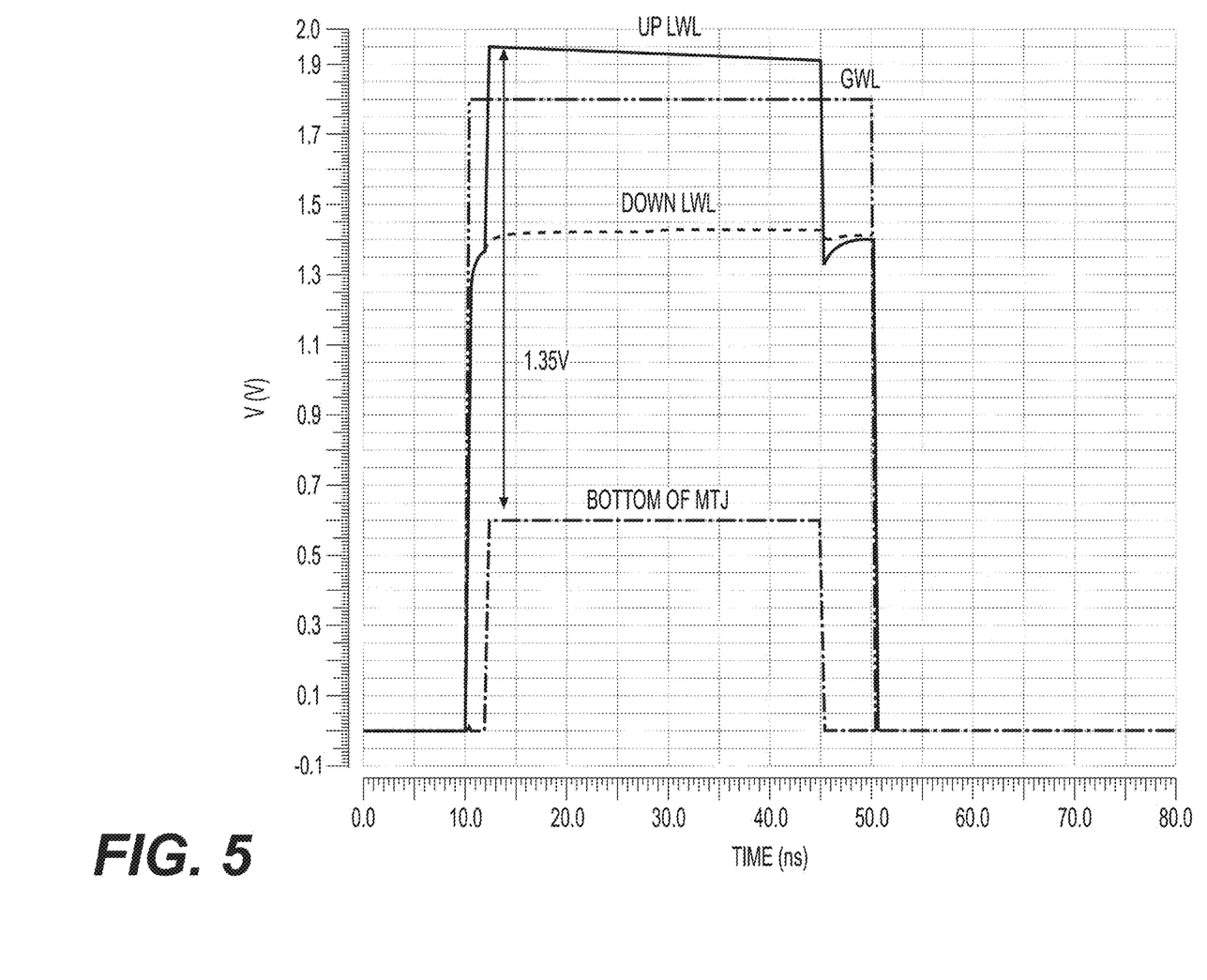
FIG. 5 depicts a timing diagram associated with certain signals included in the schematic diagram of FIG. 4, according to another aspect of the present disclosure.

FIG. 5 illustrates a timing diagram corresponding to an autoboot extracted simulation. In some embodiments, autobooting may result in a faster word line boot time. This may permit timing flexibility in driving local source lines, and the diode-connected transistor may prevent leakage to the global word line. In other embodiments contemplating a down-current write, local word lines may boot slightly depending on the local source line resistance to VSS. In yet other embodiments, autobooting may result in slower leakage on the local word line. Some examples of slow leakage during autobooting include ~45 mV 25C TT, and ~80 mV 125 C FF. In other embodiments, a loss of about 1 mV was shown on a magnetic tunnel junction after about 40 ns.

Figure 6:
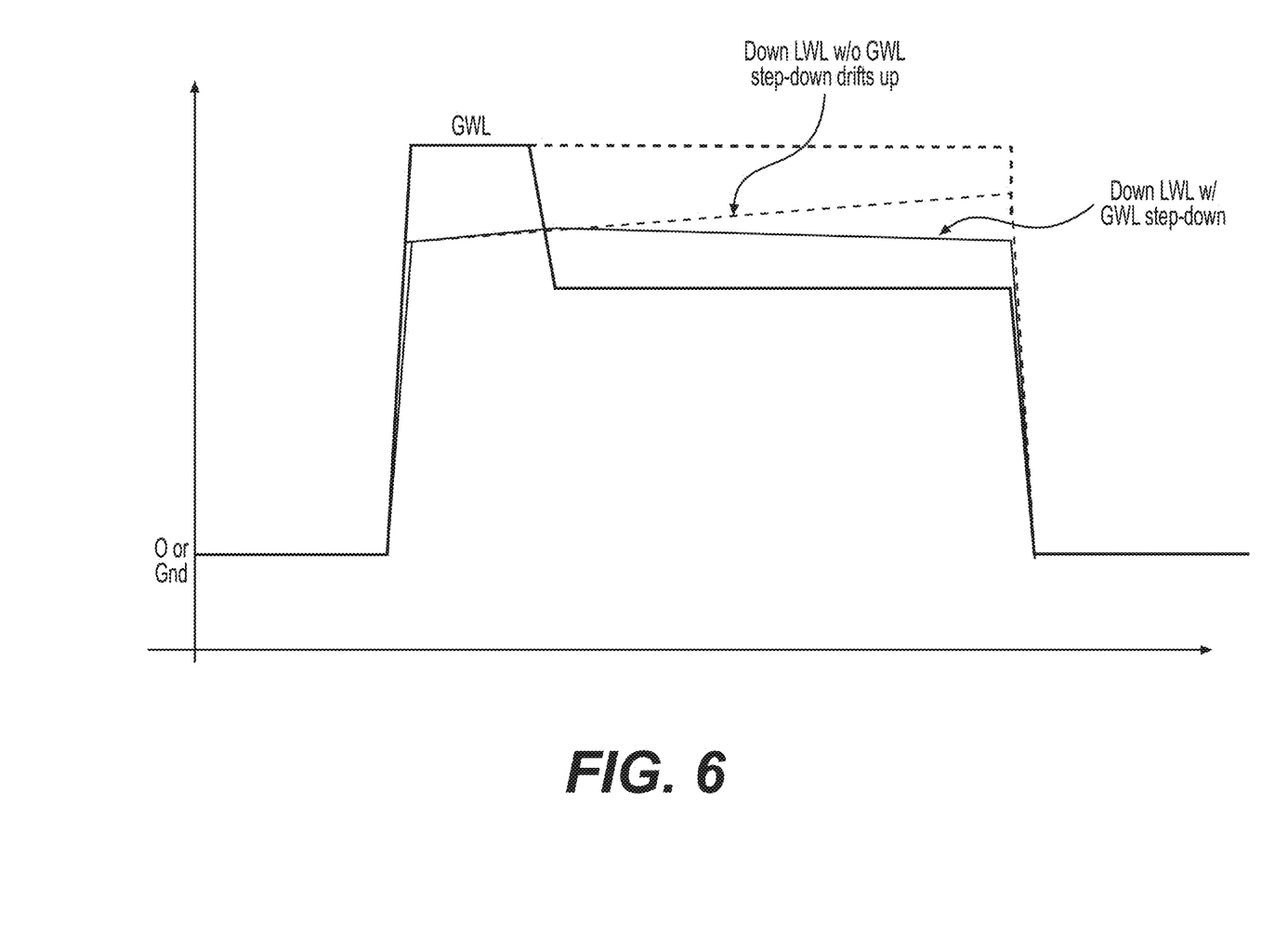
FIG. 6 depicts a timing diagram associated with certain signals included in the schematic diagram of FIG. 4, according to another aspect of the present disclosure.

Turning to FIG. 6, a timing diagram depicts the outcomes for different global word line levels. In some embodiments, a very long pulse width of a global word line pulse may result in a down-current local word line level to drift up due to leakage currents through the NMOS (n-diode) transistors. Such a drift may result in a select device (e.g., selection transistor) time-dependent dielectric breakdown (TDDB). In other embodiments, adding a transistor leakage path at a down-current local word line may be beneficial without doing any step-down level on the global word line. As an example, an off NMOS transistor may provide a transistor leakage path by appropriately sizing the transistor.

In an alternate embodiment, a method for accessing a selected memory cell in a magnetic memory may comprise: driving a first common line to a first voltage, wherein the first common line is connected to a gate of a first switching device. Driving the first common line to the first voltage results in a second voltage to pass via the first switching device to a second common line. The second common line is coupled to a set of selection transistors, wherein each selection transistor of the set of selection transistors is coupled between a first electrode of a corresponding magnetic tunnel junction in a corresponding memory cell of a set of memory cells and a third common line shared by the set of memory cells. The selected memory cell is included in the set of memory cells. After passing the second voltage to the second common line, a plurality of bit lines is driven to a first bit line voltage, wherein each bit line of the plurality of bit lines is coupled to a second electrode of a corresponding magnetic tunnel junction in a corresponding memory cell of non-selected memory cells. The non-selected memory cells are included in the set of memory cells, wherein driving the plurality of bit lines to the first bit line voltage adjusts the second voltage on the second common line to a third voltage via capacitive coupling, and wherein the third voltage on the second common line results in a first current through the selected memory cell.

In an another alternate embodiment, the first switching device is a diode-connected transistor. The diode-connected transistor is a thin-gate NMOS transistor. The first common line is a global word line. The second common line is a local word line. The third common line is a local source line. The selected memory cell includes a magnetic tunnel junction.

In another alternate embodiment, a memory may comprise: a first common line a second common line, wherein the second common line is connected to the first common line via a first switching device; a third common line; a first set of memory cells; a first plurality of bit lines; a first set of selection transistors, wherein each selection transistor of the first set of selection transistors is coupled in series with a corresponding magnetic tunnel junction in a corresponding memory cell of the first set of memory cells, wherein each selection transistor and corresponding magnetic tunnel junction are coupled in series between the third common line and a corresponding bit line of the first plurality of bit lines; first driver circuitry coupled to the first common line, the first driver circuitry configured to drive the first common line to a first voltage, wherein driving the first common line to the first voltage results in a second voltage to pass to the second common line, the second common line coupled to a gate of each selection transistor of the first set of selection transistors; second driver circuitry coupled to the first plurality of bit lines, the second driver circuitry configured to, after the second voltage has passed to the second common line, drive each bit line of non-selected memory cells to a first bit line voltage, wherein driving each bit line of the non-selected memory cells to the first bit line voltage adjusts voltage on the second common line to a third voltage, and wherein the third voltage on the second common line results in a current through the magnetic tunnel junction of a selected memory cell.

In another alternate embodiment, the memory may further include the first switching device as a diode-connected transistor. The diode-connected transistor is a thin-gate NMOS transistor. The first common line is a global word line. The second common line is a local word line. The third common line is a local source line. The selected memory cell includes a magnetic tunnel junction.

In another alternate embodiment, a spin-torque magnetic memory may comprise: a set of memory cells, wherein each memory cell of the set of memory cells is a spin-torque magnetic memory cell that includes a magnetic tunnel junction, and wherein the set of memory cells include a selected memory cell and a plurality of non-selected memory cells; a first common line a second common line, wherein the second common line is connected to the first common line via a first switching device; a third common line; a first plurality of bit lines; a first set of selection transistors, wherein each selection transistor of the first set of selection transistors is coupled in series with a corresponding magnetic tunnel junction in a corresponding memory cell of the first set of memory cells, wherein each selection transistor and corresponding magnetic tunnel junction are coupled in series between the third common line and a corresponding bit line of the first plurality of bit lines; first driver circuitry coupled to the first common line, the first driver circuitry configured to drive the first common line to a first voltage, wherein driving the first common line to the first voltage results in a second voltage to pass to the second common line, the second common line coupled to a gate of each selection transistor of the first set of selection transistors; second driver circuitry coupled to the first plurality of bit lines, the second driver circuitry configured to, after the second voltage has passed to the second common line, drive each bit line of the non-selected memory cells to a first bit line voltage, wherein driving each bit line of the non-selected memory cells to the first bit line voltage adjusts voltage on the second common line to a third voltage, and wherein the third voltage on the second common line results in a current through the magnetic tunnel junction of the selected memory cell.

In another alternate embodiment, the spin-torque magnetic memory may further include the first switching device as a diode-connected transistor. The diode-connected transistor is a thin-gate NMOS transistor. The first common line is a global word line. The second common line is a local word line. The third common line is a local source line. The selected memory cell includes a magnetic tunnel junction.

The foregoing description of the inventions has been described for purposes of clarity and understanding. It is not intended to limit the inventions to the precise form disclosed. Various modifications may be possible within the scope and equivalence of the application.

We claim:

1. A method for accessing a selected memory cell in a magnetic memory, comprising:
   driving a first common line to a first voltage, wherein the first common line is connected to a gate of a first switching device, wherein driving the first common line to the first voltage results in a second voltage to pass via the first switching device to a second common line, wherein the second common line is coupled to a set of selection transistors, wherein each selection transistor of the set of selection transistors is coupled between a first electrode of a corresponding magnetic tunnel junction in a corresponding memory cell of a set of memory cells and a third common line shared by the set of memory cells, wherein the selected memory cell is included in the set of memory cells; and
   after passing the second voltage to the second common line, driving a plurality of bit lines to a first bit line voltage, wherein each bit line of the plurality of bit lines is coupled to a second electrode of a corresponding magnetic tunnel junction in a corresponding memory cell of non-selected memory cells, wherein the non-selected memory cells are included in the set of memory cells, wherein driving the plurality of bit lines to the first bit line voltage adjusts the second voltage on the second common line to a third voltage via capacitive coupling, and wherein the third voltage on the second common line results in a first current through the selected memory cell.

2. The method of claim 1, wherein the first switching device is a diode-connected transistor.

3. The method of claim 2, wherein the diode-connected transistor is a thin-gate NMOS transistor.

4. The method of claim 1, wherein the first common line is a global word line.

5. The method of claim 1, wherein the second common line is a local word line.

6. The method of claim 1, wherein the third common line is a local source line.

7. The method of claim 6, wherein the selected memory cell includes a magnetic tunnel junction.

8. A memory, comprising:
a first common line and a second common line, wherein the second common line is connected to the first common line via a first switching device;
a third common line;
a first set of memory cells;
a first plurality of bit lines;
a first set of selection transistors, wherein each selection transistor of the first set of selection transistors is coupled in series with a corresponding magnetic tunnel junction in a corresponding memory cell of the first set of memory cells, wherein each selection transistor and corresponding magnetic tunnel junction are coupled in series between the third common line and a corresponding bit line of the first plurality of bit lines; and
first driver circuitry coupled to the first common line, the first driver circuitry configured to drive the first common line to a first voltage, wherein driving the first common line to the first voltage results in a second voltage to pass to the second common line, the second common line coupled to a gate of each selection transistor of the first set of selection transistors;
second driver circuitry coupled to the first plurality of bit lines, the second driver circuitry configured to, after the second voltage has passed to the second common line, drive each bit line of non-selected memory cells to a first bit line voltage, wherein driving each bit line of the non-selected memory cells to the first bit line voltage adjusts voltage on the second common line to a third voltage, and wherein the third voltage on the second common line results in a current through the magnetic tunnel junction of a selected memory cell.

9. The memory of claim 8, wherein the first switching device is a diode-connected transistor.

10. The memory of claim 9, wherein the diode-connected transistor is a thin-gate NMOS transistor.

11. The memory of claim 8, wherein the first common line is a local source line.

12. The memory of claim 8, wherein the second common line is a local word line.

13. The memory of claim 8, wherein the third common line is a local source line.

14. The memory of claim 8, wherein each memory cell of the first set of memory cells including a magnetic tunnel junction.

15. A spin-torque magnetic memory, comprising:
a set of memory cells, wherein each memory cell of the set of memory cells is a spin-torque magnetic memory cell that includes a magnetic tunnel junction, and wherein the set of memory cells include a selected memory cell and a plurality of non-selected memory cells;
a first common line and a second common line, wherein the second common line is connected to the first common line via a first switching device;
a third common line;
a first plurality of bit lines;
a first set of selection transistors, wherein each selection transistor of the first set of selection transistors is coupled in series with a corresponding magnetic tunnel junction in a corresponding memory cell of the first set of memory cells, wherein each selection transistor and corresponding magnetic tunnel junction are coupled in series between the third common line and a corresponding bit line of the first plurality of bit lines;
first driver circuitry coupled to the first common line, the first driver circuitry configured to drive the first common line to a first voltage, wherein driving the first common line to the first voltage results in a second voltage to pass to the second common line, the second common line coupled to a gate of each selection transistor of the first set of selection transistors; and
second driver circuitry coupled to the first plurality of bit lines, the second driver circuitry configured to, after the second voltage has passed to the second common line, drive each bit line of the non-selected memory cells to a first bit line voltage, wherein driving each bit line of the non-selected memory cells to the first bit line voltage adjusts voltage on the second common line to a third voltage, and wherein the third voltage on the second common line results in a current through the magnetic tunnel junction of the selected memory cell.

16. The spin-torque magnetic memory of claim 15, wherein the first switching device is a diode-connected transistor.

17. The spin-torque magnetic memory of claim 16, wherein the diode-connected transistor is a thin-gate NMOS transistor.

18. The spin-torque magnetic memory of claim 15, wherein the first common line is a global word line.

19. The spin-torque magnetic memory of claim 15, wherein the second common line is a local word line.

20. The spin-torque magnetic memory of claim 15, wherein the third common line is a local source line.

* * * * *